(12) United States Patent
Liu et al.

(10) Patent No.: US 12,369,417 B2
(45) Date of Patent: Jul. 22, 2025

(54) SENSING DEVICE AND ELECTRONIC DEVICE WITH OPENINGS THAT OVERLAP SENSING ELEMENTS

(71) Applicant: InnoLux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 459 days.

(21) Appl. No.: 17/558,872

(22) Filed: Dec. 22, 2021

(65) Prior Publication Data

US 2022/0238586 A1 Jul. 28, 2022

(30) Foreign Application Priority Data

Jan. 27, 2021 (CN) .......................... 202110112148.4

(51) Int. Cl.
*H10F 39/00* (2025.01)
*G02B 19/00* (2006.01)
*G06F 3/042* (2006.01)
*G06V 40/13* (2022.01)
*H10F 39/12* (2025.01)

(52) U.S. Cl.
CPC ..... *H10F 39/8063* (2025.01); *G02B 19/0009* (2013.01); *G02B 19/0076* (2013.01); *G06F 3/0421* (2013.01); *G06V 40/1318* (2022.01); *H10F 39/198* (2025.01); *H10F 39/8057* (2025.01); *H10F 39/806* (2025.01); *G02B 19/0014* (2013.01)

(58) Field of Classification Search
CPC ......... H01L 27/14627; H01L 27/14623; H01L 27/14678; H01L 27/14609; H01L 27/14625; G02B 19/0009; G02B 19/0076; G02B 19/0014; G06F 3/0421; G06V 40/1318; H10F 39/8063; H10F 39/198; H10F 39/8057; H10F 39/803; H10F 39/806; H10F 39/1515
See application file for complete search history.

(56) References Cited

U.S. PATENT DOCUMENTS

| 2011/0128400 A1* | 6/2011 | Wakano | H01L 27/14609 348/222.1 |
| 2019/0229141 A1* | 7/2019 | Kim | H10F 39/807 |
| 2020/0035729 A1* | 1/2020 | Lee | H01L 27/14621 |
| 2020/0203405 A1* | 6/2020 | Lee | H10F 39/8057 |
| 2020/0293740 A1* | 9/2020 | Yao | G06V 10/145 |

(Continued)

FOREIGN PATENT DOCUMENTS

| CN | 109255285 A | * | 1/2019 | ........... A61B 5/0022 |
| CN | 111539392 A | | 8/2020 | |

*Primary Examiner* — Georgia Y Epps
*Assistant Examiner* — Erin R Garber
(74) *Attorney, Agent, or Firm* — McClure, Qualey & Rodack, LLP

(57) ABSTRACT

A sensing device is provided. The sensing device includes a sensing circuit, a plurality of sensing elements, and a plurality of light-collecting elements. The light-collecting elements are for collecting lights to the plurality of sensing elements. The plurality of sensing elements are configured to generate a plurality of sensing signals according to the lights that are collected, and output the plurality of sensing signals as a whole to the sensing circuit.

15 Claims, 10 Drawing Sheets

(56) References Cited

U.S. PATENT DOCUMENTS

| | | | |
|---|---|---|---|
| 2021/0020710 A1* | 1/2021 | Park | H10K 59/88 |
| 2021/0157441 A1* | 5/2021 | Chen | G06F 3/0412 |
| 2021/0225926 A1 | 7/2021 | Peng et al. | |
| 2022/0068991 A1* | 3/2022 | Tanaka | H10F 39/18 |
| 2022/0120873 A1* | 4/2022 | Boukhayma | G01S 7/4876 |
| 2022/0293657 A1* | 9/2022 | Chou | G02B 5/003 |
| 2022/0328540 A1* | 10/2022 | Kawano | H04N 1/0306 |

* cited by examiner

SENSING DEVICE AND ELECTRONIC DEVICE WITH OPENINGS THAT OVERLAP SENSING ELEMENTS

CROSS REFERENCE TO RELATED APPLICATIONS

This application claims the benefit of China Application No. 202110112148.4, filed Jan. 27, 2021, the entirety of which is incorporated by reference herein.

BACKGROUND

Technical Field

The present disclosure is related to a sensing device and an electronic device, and in particular it is related to an electronic device that can increase the sensitivity of the sensing device.

Description of the Related Art

Optical sensing devices are widely used in consumer electronics such as smartphones and wearable devices etc., and have become indispensable necessities in modern society. With the flourishing development of such consumer electronics, consumers have high expectations regarding the quality, functionality, or price of these products.

The sensing element in the optical sensing device can convert the received light into an electrical signal, and the generated electrical signal can be transmitted to the driving element and logic circuit in the optical sensing device for processing and analysis. Generally, the sensitivity of the sensing element is affected by quantum efficiency and photoelectric conversion efficiency, and the photoelectric conversion efficiency is mainly affected by the equivalent capacitance of the sensing element.

In order to increase the sensitivity of the sensing element and thereby improve the performance of the sensing device, the development of a structural design that can further reduce the equivalent capacitance of the sensing element is still currently an important research topic in the industry.

SUMMARY

In accordance with some embodiments of the present disclosure, a sensing device is provided. The sensing device includes a sensing circuit, a plurality of sensing elements, and a plurality of light-collecting elements. The light-collecting elements are for collecting lights to the plurality of sensing elements. The plurality of sensing elements are configured to generate a plurality of sensing signals according to the lights that are collected, and output the plurality of sensing signals as a whole to the sensing circuit.

In accordance with some embodiments of the present disclosure, an electronic device is also provided. The electronic device includes a display device and a sensing device, and the sensing device is disposed opposite the display device. In addition, the sensing device includes a sensing circuit, a plurality of sensing elements, and a plurality of light-collecting elements. The light-collecting elements are for collecting lights to the plurality of sensing elements. The plurality of sensing elements are configured to generate a plurality of sensing signals according to the lights that are collected, and output the plurality of sensing signals as a whole to the sensing circuit.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
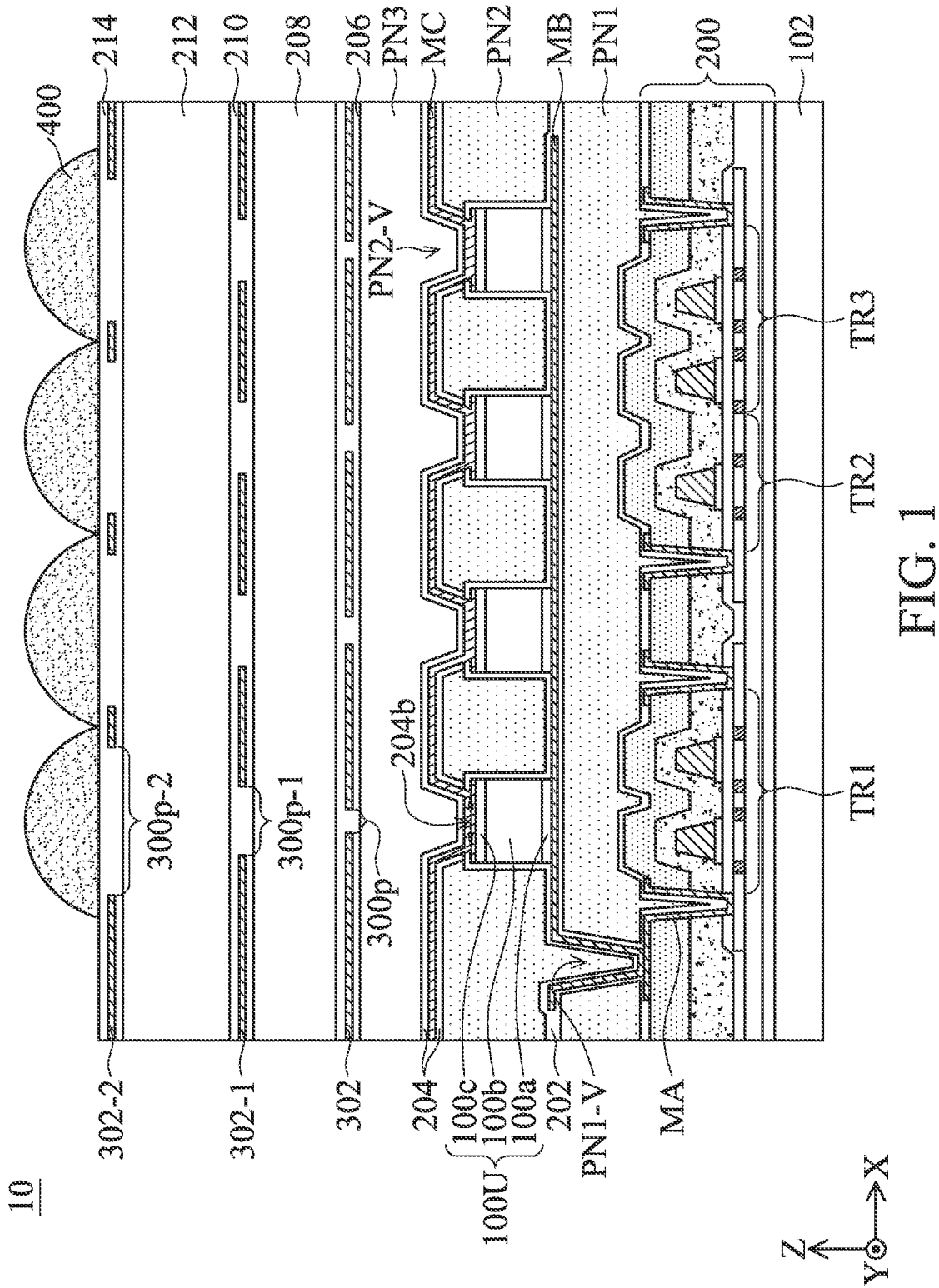
FIG. 1 is a cross-sectional diagram of a sensing device in accordance with some embodiments of the present disclosure.

The sensing device and the electronic device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on/over a second material layer", may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on/over the second material layer" means that the first material layer is in direct contact with the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. Accordingly, the first element in the specification may refer to the second element in the claims.

In accordance with the embodiments of the present disclosure, regarding the terms such as "connected", "interconnected", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected" or "electrically coupled" may include any direct or indirect electrical connection means.

In the following descriptions, terms "about" and "substantially" typically mean+/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a sensing device including a plurality of light-collecting elements is provided. The light-collecting elements of the sensing device can collect lights to a plurality of sensing elements, and the sensing elements can convert the collected lights into a plurality of sensing signals, and the sensing signals generated by these sensing elements are output as a whole to a terminal of the sensing circuit. Furthermore, in accordance with some embodiments of the present disclosure, the areas that are not irradiated by the lights collected from the light-collecting elements may not be provided with the sensing element. In accordance with the embodiments of the present disclosure, through the configuration design of the sensing circuit and the sensing element, the equivalent capacitance of the sensing element can be reduced, the sensitivity of the sensing element can be improved, or the overall performance of the sensing device can be improved.

Refer to FIG. 1, which is a cross-sectional diagram of a sensing device 10 in accordance with some embodiments of the present disclosure. It should be understood that, for clear description, some elements of the sensing device 10 may be omitted in the drawing, and only some elements are schematically shown. In accordance with some embodiments, additional features may be added to the sensing device 10 described below. In accordance with some other embodiments, some of the features of the sensing device 10 described below may be replaced or omitted.

As shown in FIG. 1, in some embodiments, the sensing device 10 includes a substrate 102, an active layer 200, sensing elements 100U, and light-collecting elements 400. The active layer 200 is disposed on the substrate 102, and the sensing elements 100U are disposed on the active layer 200, and the light-collecting elements 400 are disposed on the sensing elements 100U. In addition, a sensing circuit SC of the sensing device 10 is disposed in the active layer 200.

In some embodiments, the substrate 102 includes a flexible substrate, a rigid substrate, or a combination thereof, but it is not limited thereto. In some embodiments, the material of the substrate 102 may include, but is not limited to, glass, quartz, sapphire, ceramic, polyimide (PI), polycarbonate (PC), polyethylene terephthalate (PET), polypropylene (PP), another suitable material, or a combination thereof. Furthermore, in some embodiments, the substrate 102 may include a metal-glass fiber composite plate, or a metal-ceramic composite plate, but it is not limited thereto. In addition, the light transmittance of the substrate 102 may not be limited. That is, the substrate 102 may be a light-transmitting substrate, a semi-transmitting substrate, or a non-transmitting substrate.

In some embodiments, the sensing device 10 further includes a buffer layer (not illustrated), and the buffer layer is disposed between the substrate 102 and the active layer 200. Furthermore, in some embodiments, the active layer 200 includes thin-film transistors, such as a thin-film transistor TR1, a thin-film transistor TR2, and a thin-film transistor TR3 shown in the figure, and the active layer 200 may include conductive elements and signal lines that are electrically connected to the thin-film transistors, insulating layers formed between conductive elements, and planarization layers, and so on. In some embodiments, the signal lines include, for example, current signal lines, voltage signal lines, high-frequency signal lines, and low-frequency signal lines, and the signal lines that can transmit device operating voltage (VDD), common ground voltage (VSS), or the voltage driving device terminal, but the present disclosure is not limited thereto.

In some embodiments, thin-film transistors may include switching transistors, driving transistors, reset transistors, transistor amplifiers, or another suitable thin-film transistor. Specifically, in some embodiments, the thin-film transistor TR1 may be a reset transistor, the thin-film transistor TR2 may be a transistor amplifier or a source follower, and the thin-film transistor TR3 may be a switching transistor, but it is not limited thereto.

It should be understood that the number of thin-film transistors is not limited to that shown in the figure. According to different embodiments, the sensing device 10 may have another suitable number or type of thin-film transistor. Furthermore, the types of thin-film transistors may include top gate thin-film transistors, bottom gate thin-film transistors, dual gate or double gate thin-film transistors, or a combination thereof. In some embodiments, the thin-film transistor may be further electrically connected to the capacitor elements, but it is not limited thereto. Furthermore, the thin-film transistor may include at least one semiconductor layer, a gate dielectric layer, and a gate electrode layer. The thin-film transistor can exist in various forms well known to those skilled in the art, and the detailed structure of the thin-film transistor will not be repeated herein.

Furthermore, in some embodiments, the sensing device 10 includes a planarization layer PN1, and the planarization layer PN1 is disposed on the active layer 200 and between the active layer 200 and the sensing elements 100U. The sensing elements 100U are disposed on the planarization layer PN1, and are electrically connected to a conductive layer MA in the active layer 200 through a conductive layer MB, and thereby electrically connected to the thin-film transistor TR1, the thin-film transistor TR2, and the thin-film transistor TR3.

In some embodiments, the conductive layer MB may penetrate through the planarization layer PN1 to be electrically connected to the conductive layer MA, and the conductive layer MA may, for example, penetrate through the gate dielectric layer (not labeled) and the dielectric layer (not labeled) to be electrically connected to the semiconductor layer of the thin-film transistor TR1, but it is not limited thereto. Specifically, in some embodiments, a part of the planarization layer PN1 may be removed by a patterning process to form a through hole PN1-V, then a passivation layer 202 may be formed on the planarization layer PN1 and in the through hole PN1-V, and then the conductive layer MB may be formed on the passivation layer 202. In addition, the conductive layer MB may also be formed in the through hole PN1-V, and then the passivation layer 202 may be formed on the conductive layer MB.

In some embodiments, the material of the planarization layer PN1 may include organic materials, inorganic materials, another suitable material, or a combination thereof, but it is not limited thereto. For example, the inorganic material may include, but is not limited to, silicon nitride, silicon oxide, silicon oxynitride, aluminum oxide, another suitable material, or a combination thereof. For example, the organic material may include, but is not limited to, epoxy resins, silicone resins, acrylic resins (such as polymethylmetacrylate (PMMA)), polyimide, perfluoroalkoxy alkane (PFA), another suitable material, or a combination thereof.

In some embodiments, the planarization layer PN1 may be formed using a chemical vapor deposition process, a physical vapor deposition process, a coating process, a printing process, another suitable process, or a combination thereof. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, but it is not limited thereto. The physical vapor deposition process may include, for example, a sputtering process, an evaporation process, a pulsed laser deposition process, but it is not limited thereto.

Furthermore, the planarization layer PN1 may be patterned by a photolithography process and/or an etching process. In some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

In some embodiments, the conductive layer MA and the conductive layer MB may include conductive materials, such as metal conductive materials, transparent conductive materials, other suitable conductive materials, or a combination thereof, but they are not limited thereto. For example, the metal conductive material may include, but is not limited to, copper (Cu), silver (Ag), gold (Au), tin (Sn), aluminum (Al), molybdenum (Mo), tungsten (W), chromium (Cr), nickel (Ni), platinum (Pt), titanium (Ti), alloys of the foregoing metals, another suitable material, or a combination thereof. The transparent conductive material may include transparent conductive oxide (TCO), for example, indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In some embodiments, the conductive layer MA and the conductive layer MB may be formed using a chemical vapor deposition process, a physical vapor deposition process, an electroplating process, an electroless plating process, another suitable process, or a combination thereof.

In some embodiments, the passivation layer 202 may have a single-layer structure or a multiple-layer structure, and the material of the passivation layer 202 may include an inorganic material, an organic material, or a combination thereof, but it is not limited thereto. For example, the inorganic material may include, but is not limited to, silicon nitride, silicon oxide, silicon oxynitride, another suitable material, or a combination thereof. For example, the organic material may include, but is not limited to, polyethylene terephthalate (PET), polyethylene (PE), polyethersulfone (PES), polycarbonate (PC), polymethylmethacrylate (PMMA), polyimide (PI), another suitable material, or a combination thereof.

In some embodiments, the passivation layer 202 may be formed using a coating process, a chemical vapor deposition process, a physical vapor deposition process, a printing process, an evaporation process, a sputtering process, another suitable process, or a combination thereof.

Furthermore, in some embodiments, the sensing device 10 further includes a planarization layer PN2 disposed on the passivation layer 202, and parts of the planarization layer PN2 are disposed between the sensing elements 100U. That is, the planarization layer PN2 is disposed on the passivation layer 202, and parts of the planarization layer PN2 are removed by a patterning process to form a plurality of through holes PN2-V, and a plurality of sensing elements 100U are respectively disposed in the through holes PN2-V. In this way, the sensing elements 100U are separated from each other. In addition, it should be understood that although the sensing device 10 in the figure has four sensing elements 100U, the present disclosure is not limited thereto. In accordance with different embodiments, the sensing device 10 may have another suitable number of sensing elements 100U.

Specifically, in some embodiments, a first electrode layer material, a body region material, and a second electrode layer material may be sequentially formed on the passivation layer 202 using a chemical vapor deposition process, a physical vapor deposition process, or an ion implantation process, and then parts of the first electrode layer material, the body region material, and the second electrode layer material may be removed by a photolithography process and/or an etching process to form a plurality of separate sensing elements 100U. Next, the planarization layer PN2 may be formed to cover the sensing elements 100U. The material and method for forming the planarization layer PN2 are similar to those of the aforementioned planarization layer PN1, and thus will not be repeated here.

In addition, the sensing elements 100U are disposed on the passivation layer 202. The sensing elements 100U can receive lights and convert the received lights into electrical signals. The generated electrical signals can be transmitted to the active layer 200, and processed and analyzed by the sensing circuit SC in the active layer 200. In some embodiments, the sensing element 100U includes a photodiode, other elements that can convert optical signals to electrical signals, or a combination thereof, but it is not limited thereto.

In some embodiments, the sensing element 100U has a first doped layer 100a, an intrinsic layer 100b, and a second doped layer 100c, and the intrinsic layer 100b may be disposed between the first doped layer 100a and the second doped layer 100c. In some embodiments, the sensing element 100U has a P-I-N structure, an N-I-P structure, or another suitable structure, but it is not limited thereto.

In some embodiments, the first doped layer 100a may be, for example, an N-type doped region, the second doped layer 100c may be, for example, a P-type doped region, and they may be combined with the intrinsic layer 100b to form an N-I-P structure. The material of the element 100U may include a semiconductor material, for example, may include silicon or another suitable material.

In some embodiments, when lights irradiate the sensing elements 100U having the aforementioned structure, pairs of electrons and electron holes are generated to produce photocurrents, but it is not limited thereto.

In some embodiments, the first doped layer 100a and the intrinsic layer 100b, and the second doped layer 100c may be formed using a chemical vapor deposition process, a physical vapor deposition process, an electroplating process, an electroless plating process, another suitable process, or a combination thereof. In some embodiments, the conductive layer MC is disposed on the sensing elements 100U, the second doped layers 100c of the sensing elements 100U are electrically connected to the conductive layer MC, and the first doped layers 100a are electrically connected to the conductive layer MB. In some embodiments, the conductive layer MC penetrates through the passivation layer 204 and be electrically connected to the second doped layer 100c. In detail, in some embodiments, parts of the passivation layer 204 may be removed by a patterning process to form through holes 204b above the sensing elements 100U. Specifically, the passivation layer 204 may be formed on the planarization layer PN2 and in the through holes PN2-V, and then the conductive layer MC may be formed on the passivation layer 204. In addition, the conductive layer MC also may be formed in the through holes PN2-V, and then the passivation layer 204 may be formed on the conductive layer MC.

The materials and methods for forming the conductive layer MC are similar to those of the aforementioned conductive layer MA and conductive layer MB, and the materials and methods for forming the passivation layer 204 are similar to those of the aforementioned passivation layer 202, and thus will not be repeated here. In addition, in some embodiments, the material of the conductive layer MC is a transparent conductive material, which can reduce the influence on the photosensitive efficiency of the sensing element 100U.

Still referring to FIG. 1, light-collecting elements 400 are disposed above the sensing elements 100U. The light-collecting elements 400 are used to collect lights to the sensing elements 100U. It should be noted that the sensing elements 100U are configured to generate a plurality of sensing signals according to the lights that are collected by the light-collecting elements 400, and the sensing elements 100U can output the sensing signals as a whole to the sensing circuit SC. The circuit diagram regarding the signal transmission will be described in FIG. 3. As shown in FIG. 1, the sensing elements 100U are electrically connected to the conductive layer MB, and the conductive layer MB is used as a signal transmission terminal of the sensing elements 100U, for example, a terminal FD shown in FIG. 3.

In some embodiments, in a normal direction of the substrate 102 (for example, the Z direction in the figure), the sensing element 100U and the light-collecting element 400 at least partially overlap. In some embodiments, in the normal direction of the substrate 102 (for example, the Z direction in the figure), the part of the planarization layer PN2 disposed between the sensing elements 100U also at least partially overlaps the light-collecting element 400. In some embodiments, the number of sensing elements 100U is less than or equal to the number of light-collecting elements 400. According to the present disclosure, "overlap", "partially overlap" or "at least partially overlap" means that two elements have overlapping parts with each other. That is, a part of element A and a part of element B overlap each other. Alternatively, in the normal direction of 102 (for example, the Z direction in the figure), a projection of element A on the substrate 102 overlaps a projection of element B on the substrate 102.

In some embodiments, the light-collecting elements 400 may be a micro-lens or other structure with a light-collecting effect. In some embodiments, the material of the light-collecting element 400 may include silicon oxide, polymethylmethacrylate (PMMA), cycloolefin polymer (COP), polycarbonate (PC), another suitable material, or a combination thereof, but it is not limited thereto.

In addition, in some embodiments, the light-collecting element 400 may be formed by a chemical vapor deposition process, a physical vapor deposition process, a coating process, a printing process, another suitable process, or a combination thereof. In addition, the light-collecting element 400 may be patterned to have a suitable shape and profile by a photolithography process and/or an etching process.

In accordance with the embodiments of the present disclosure, the arrangement of the light-collecting elements 400 helps to concentrate the lights on a specific area, for example, the lights can be collected on a plurality of sensing elements 100U. It should be noted that according to the present disclosure, parts of the planarization layer PN2 are removed through a patterning process to form a plurality of through holes PN2-V, and a plurality of sensing elements 100U are respectively disposed in the through holes PN2-V, so that a plurality of sensing elements 100U are arranged in a discontinuous manner. In other words, two adjacent sensing elements 100U among the sensing elements 100U may be separated by parts of the planarization layer PN2. In some embodiments, portions that are irradiated by the lights collected from the light-collecting elements 400 are provided with the sensing elements 100U, and portions that are not irradiated by the light collected from the light-collecting elements 400 are provided with the planarization layer (for example, the planarization layer PN2 may be disposed at the portion between two adjacent sensing elements 100U that are not irradiated by light collected from the light-collecting elements 400), thereby reducing the portions of the sensing elements 100U that may not be irradiated by light. For example, when several sensing elements 100U are integrated into a large sized sensing element 100U (that is, when the planarization layer PN2 is reduced or deleted), many areas of the sensing element 100U may not be irradiated by light. In this way, the photocurrent produced by the sensing elements 100U will be affected by parasitic capacitance in a greater degree, thereby reducing the photoelectric conversion efficiency or sensitivity. In accordance with the embodiments of the present disclosure, the areas that are not irradiated by the lights collected from the light-collecting elements 400 may not be provided with the sensing element 100U (for example, the planarization layer PN2 is provided), thereby reducing the chance that the photocurrents of the sensing element 100U being affected by parasitic capacitance. Accordingly, the sensitivity of the sensing element 100U can be improved, or the overall performance of the sensing device 10 can be enhanced.

Still referring to FIG. 1, in some embodiments, the sensing device 10 further includes a planarization layer PN3 and a light-shielding layer 302 disposed on the sensing elements 100U. The planarization layer PN3 and the light-shielding layer 302 are disposed between the sensing elements 100U and the light-collecting elements 400, and the light-shielding layer 302 has a plurality of openings 300p. In some embodiments, the opening 300p overlaps the sensing element 100U in the normal direction of the substrate 102 (for example, the Z direction in the figure). In some embodiments, the opening 300p overlaps the light-collecting element 400 in the normal direction of the substrate 102 (for example, the Z direction in the figure).

The light-shielding layer 302 can reduce the reflectivity of light. For example, the light-shielding layer 302 can absorb the light reflected by the conductive layer MB or the light reflected back and forth between conductive layers to achieve the effect of anti-reflection or reducing light noise. In some embodiments, the light-shielding layer 302 may include a metal material, and the metal material may include copper (Cu), aluminum (Al), molybdenum (Mo), indium (In), ruthenium (Ru), tin (Sn), gold (Au)), platinum (Pt), zinc (Zn), silver (Ag), titanium (Ti), lead (Pb), nickel (Ni), chromium (Cr), magnesium (Mg), palladium (Pd), alloys of the foregoing metals, another suitable metal material, or a combination thereof, but it is not limited thereto.

Furthermore, in some embodiments, the light-shielding layer 302 may be formed by a chemical vapor deposition process, a physical vapor deposition process, an electroplating process, an electroless plating process, another suitable process, or a combination thereof. In addition, the light-shielding layer 302 may be patterned by a photolithography process and/or an etching process to have the opening 300p. The opening 300p has an opening width. For example, the opening width of the opening 300p may be greater than or equal to 2 micrometers (µm) and less than or equal to 6 micrometers (µm) (i.e. 2 µm≤opening width of the opening 300p≤6 µm), such as 3 µm, 4 µm, or 5 µm.

Specifically, in some embodiments, a passivation layer 206 may be formed on the planarization layer PN3 before the light-shielding layer 302 is formed, and then parts of the light-shielding layer 302 may be removed by a patterning process to form the openings 300p. Next, the passivation layer 206 may be formed on the light-shielding layer 302 and in the openings 300p. Furthermore, the material and method for forming the passivation layer 206 are similar to those of the aforementioned passivation layer 202, and thus will not be repeated here.

Furthermore, in some embodiments, the sensing device optionally includes a color filter layer disposed on the passivation layer 206. In some embodiments, the color filter layer may include a red filter unit, a green filter unit, a blue filter unit, a white filter unit, or other color filter units, but it is not limited thereto. According to different embodiments, the color filter layer may have any suitable number or color of color filter units.

In some embodiments, the sensing device 10 further includes a dielectric layer 208, a light-shielding layer 302-1, and a passivation layer 210. The dielectric layer 208 is disposed on the passivation layer 206, and the light-shielding layer 302-1 has a plurality of openings 300p-1. The opening 300p-1 has an opening width. For example, the opening width of the opening 300p-1 may be greater than or equal to 6 µm and less than or equal to 10 µm (i.e. 6 µm≤opening width of the opening 300p-1≤10 µm), such as 7 µm, 8 µm, or 9 µm. Alternatively, the opening width of the opening 300p-1 may be greater than or equal to 0.5 times the opening width of the opening 300p, and less than or equal to 2.5 times the opening width of the opening 300p. In some embodiments, the opening 300p-1 overlaps the sensing element 100U in the normal direction of the substrate 102 (for example, the Z direction in the figure). In some embodiments, the opening 300p-1 overlaps the light-collecting element 400 in the normal direction of the substrate 102 (for example, the Z direction in the figure).

Furthermore, in some embodiments, the opening 300p-1 overlaps the opening 300p in the normal direction of the substrate 102 (for example, the Z direction in the figure). In some embodiments, the width of the opening 300p-1 is greater than the width of the opening 300p. Specifically, in some embodiments, the width of the opening 300p-1 may be, for example, 8 µm and the width of the opening 300p may be, for example, 4 µm, but it is not limited thereto. In accordance with the embodiments of the present disclosure, the width of the opening of the light-shielding layer 302 refers to the maximum width of the bottom of the opening in a direction perpendicular to the normal direction of the substrate 102 (for example, the X direction in the figure).

In some embodiments, the dielectric layer 208 may include an organic dielectric material or an inorganic dielectric material. For example, the organic insulating material may include, but is not limited to, perfluoroalkoxy alkane (PFA), polytetrafluoroethylene (PTFE), fluorinated ethylene propylene (FEP), polyethylene, another suitable material, or a combination thereof. For example, the inorganic insulating material may include, but is not limited to, silicon oxide, silicon nitride, silicon oxynitride, other high-k dielectric materials, or a combination thereof.

Furthermore, the materials and methods for forming the light-shielding layer 302-1 are similar to those of the aforementioned light-shielding layer 302, and the materials and methods for forming the passivation layer 210 are similar to those of the aforementioned passivation layer 202, and thus will not be repeated here.

As shown in FIG. 1, in some embodiments, the sensing device 10 further includes a dielectric layer 212, a light-shielding layer 302-2, and a passivation layer 214. The dielectric layer 212 is disposed on the passivation layer 210, and the light-shielding layer 302-2 has a plurality of openings 300p-2. The opening 300p-2 has an opening width. For example, the opening width of the opening 300p-2 may be greater than or equal to 12 μm and less than or equal to 16 μm (i.e. 12 μm≤opening width of the opening 300p-2≤16 μm), such as 13 μm, 14 μm, or 15 μm. Alternatively, the opening width of the opening 300p-2 may be greater than or equal to 2 times the opening width of the opening 300p, and less than or equal to 4 times the opening width of the opening 300p. In some embodiments, the opening 300p-2 overlaps the sensing element 100U in the normal direction of the substrate 102 (for example, the Z direction in the figure). In some embodiments, the opening 300p-2 overlaps the light-collecting element 400 in the normal direction of the substrate 102 (for example, the Z direction in the figure).

Moreover, in some embodiments, the opening 300p-2 overlaps the opening 300p-1 and the opening 300p in the normal direction of the substrate 102 (for example, the Z direction in the figure). In some embodiments, the width of the opening 300p-2 is greater than the width of the opening 300p-1. For example, the width of the opening 300p-2 may be 14 μm, and the width of the opening 300p-1 may be 8 μm, but it is not limited thereto. In some embodiments, when the opening width of the opening 300p-2 is greater than or equal to 2 times the opening width of the opening 300p, and less than or equal to 4 times the opening width of the opening 300p, and when the opening width of the opening 300p-1 is greater than or equal to 0.5 times the opening width of the opening 300p, and less than or equal to 2.5 times the opening width of the opening 300p, the angles of the lights incident on the sensing element 100U are substantially the same. In other words, through the above design, the sensing device 10 can have a collimator-like structure so that the lights incident on the sensing element 100U are substantially parallel to the normal direction of the substrate 102 (for example, the Z direction in the figure). Therefore, the sensitivity of the sensing device can be improved. Especially, it is helpful to improve the sensitivity of the sensing devices that are applied to in-display fingerprint recognition, but it is not limited thereto.

Figure 2:
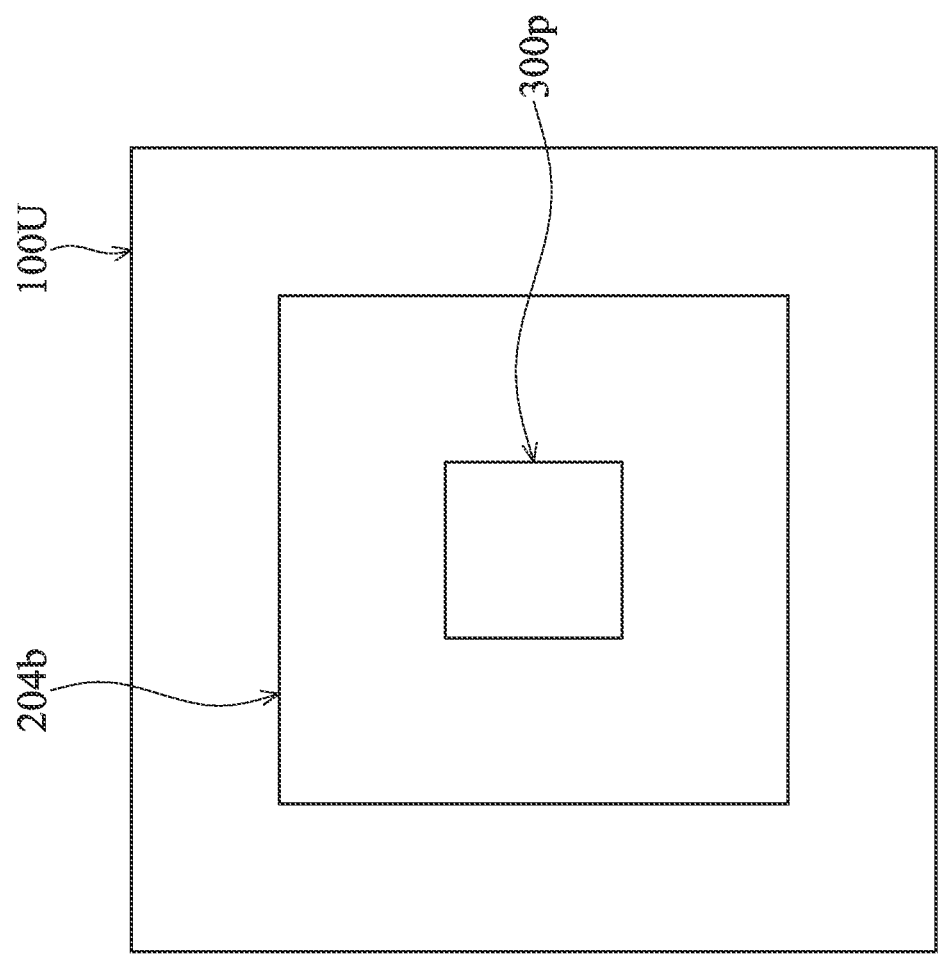
FIG. 2 is a top-view diagram of some elements of a sensing device in accordance with some embodiments of the present disclosure.

Next, refer to FIG. 2, which is a top-view diagram of the sensing element 100U, the bottom surface of the opening 204b of the passivation layer 204 and the opening 300p in the partial sensing device 10 in accordance with some embodiments of the present disclosure. FIG. 2 schematically illustrates the width relationship among a set of sensing element 100U, the bottom surface of the opening 204b of the passivation layer 204, and the opening 300p. It should be understood that the same or similar components (or elements) in the following paragraph will be denoted by the same or similar reference numbers, and their materials, manufacturing methods and functions are the same or similar to those described above, and thus they will not be repeated in the following context.

As shown in FIG. 2, in some embodiments, the width of the bottom surface of the opening 204b of the passivation layer 204 is smaller than the width of the sensing element 100U, and the width of the opening 300p is smaller than the width of the sensing element 100U. The width of the bottom surface 204b may be, for example, greater than or equal to 2 μm and less than or equal to 5 μm (i.e. 2 μm≤width of the bottom surface 204b≤5 μm), such as 3 μm, or 4 μm. The width of the sensing element 100U may be, for example, greater than or equal to 8 μm and less than or equal to 12 μm (i.e. 8 μm≤width of the sensing element 100U≤12 μm), such as 9 μm, 10 μm, or 11 μm. The bottom surface of the opening 204b of the passivation layer 204 refers to the width of the bottommost part of the opening 204b of the passivation layer 204 that is disposed above the sensing element 100U. With the design that the width of the bottom surface 204b of the passivation layer 204 being smaller than the width of the sensing element 100U, and the width of the opening 300p being smaller than the width of the sensing element 100U, the lights incident on the sensing element 100U are substantially parallel to the normal direction of the substrate 102 (for example, the Z direction in the figure). Therefore, the optical signals of the sensing element 100U can be effectively increased, or the sensitivity of the sensing device can be improved. In accordance with the embodiments of the present disclosure, the width of the aforementioned element refers to the distance of the bottommost part of the element along the X direction in a plane that is perpendicular to the normal direction of the substrate 102 (for example, the X-Y plane in the drawing).

Furthermore, it should be understood that, in accordance with the embodiments of the present disclosure, an optical microscope (OM), a scanning electron microscope (SEM), a film thickness profiler (α-step), an ellipsometer or another suitable method may be used to measure the width, thickness, height or area of the element, or the distance or pitch between elements. Specifically, in some embodiments, a scanning electron microscope may be used to obtain a cross-sectional image including the elements to be measured, and the width, thickness, height or area of the element, or the distance or pitch between elements in the image can be measured.

Figure 3:
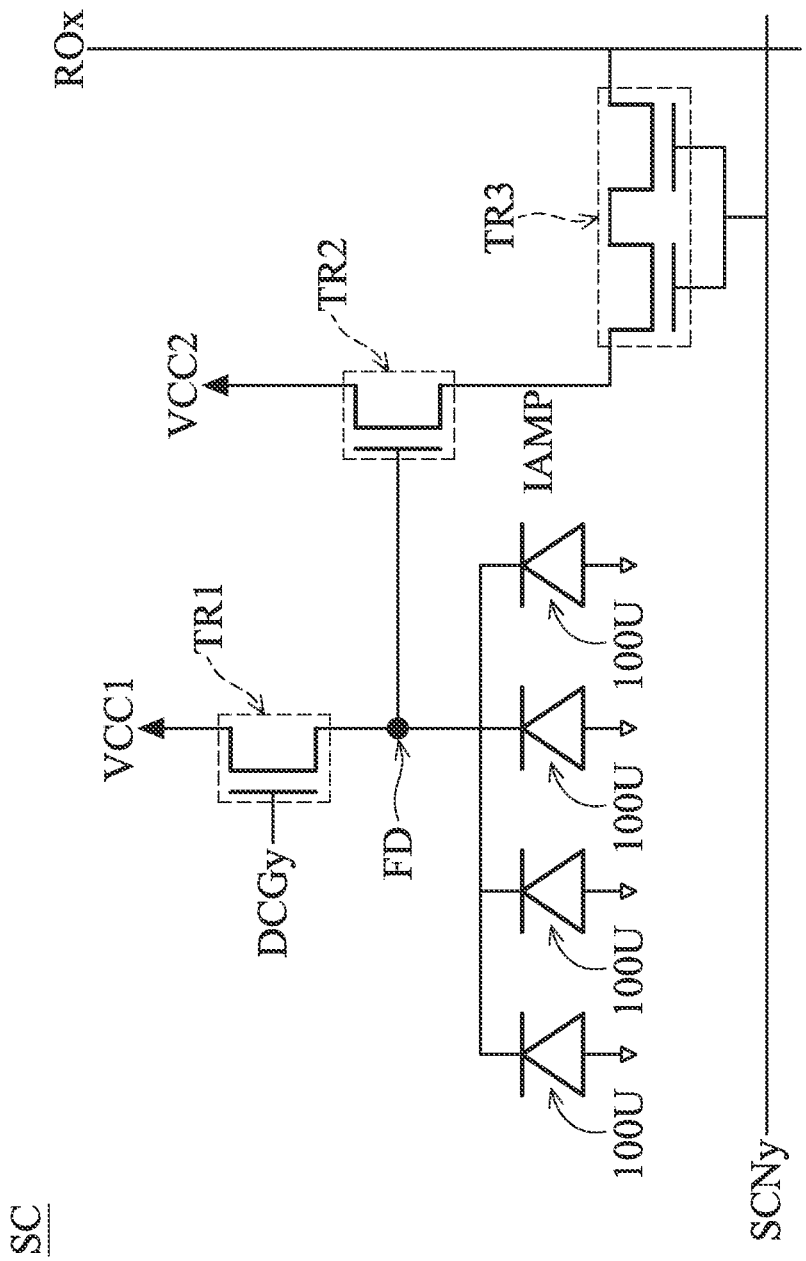
FIG. 3 is an equivalent circuit diagram of a sensing circuit in accordance with some embodiments of the present disclosure.

FIG. 3 is an equivalent circuit diagram of a sensing circuit SC in accordance with some embodiments of the present disclosure. As shown in FIG. 3, in some embodiments, each of the sensing elements 100U is electrically connected to a terminal FD of the sensing circuit SC, and the sensing elements 100U are arranged discontinuously and electrically connected to each other in parallel. In some embodiments, the terminal FD is a floating diffusion node. As described above, a plurality of sensing elements 100U that are arranged in a discontinuous manner generate a plurality of sensing signals according to the collected lights, and transmit these sensing signals as a whole to the terminal FD. Specifically, according to the present disclosure, "as a whole" refers to that, for example, the sensing signals of a plurality of parallel-connected sensing elements 100U are integrated into a sensing signal before being transmitted to the terminal FD. According to the embodiments of the present disclosure, the configuration in which a plurality of sensing elements 100U are arranged discontinuously and electrically connected to each other in parallel can reduce the equivalent capacitance of the sensing elements 100U or improve the sensitivity and performance of the sensing device.

In some embodiments, the thin-film transistor TR1 and the thin-film transistor TR2 are electrically connected to the terminal FD, and the thin-film transistor TR2 is further electrically connected to the thin-film transistor TR3. In some embodiments, the thin-film transistor TR1 can reset the potential of the terminal FD to give an initial potential, and the photocurrents generated by the sensing elements 100U can change the potential of the terminal FD, and the signals generated by the current can be transmitted by the thin-film transistor TR2 and the thin-film transistor TR3.

Furthermore, as described above, the sensing circuit SC includes the thin-film transistor TR1, the thin-film transistor TR2, and the thin-film transistor TR3. In addition, a plurality of sensing elements 100U are coupled to a system voltage line VCC1.

The thin-film transistor TR1 includes a first terminal coupled to the system voltage line VCC1, a second terminal coupled to the terminal FD, and a control terminal coupled to a control signal DCGy. The thin-film transistor TR1 can connect or disconnect the system voltage line VCC1 according to the control signal DCGy. When the thin-film transistor TR1 is connected to the system voltage line VCC1, the potential of the terminal FD can be reset. When the thin-film transistor TR1 is disconnected from the system voltage line VCC1, the potential of the terminal FD is not reset.

The thin-film transistor TR2 includes a first terminal coupled to the system voltage line VCC2, a second terminal coupled to the first terminal of the thin-film transistor TR3, and a control terminal coupled to the second terminal of the thin-film transistor TR1 and the terminal FD. The thin-film transistor TR2 is used to amplify the voltage of the terminal FD to generate an amplified current IAMP.

The thin-film transistor TR3 includes a first terminal coupled to the second terminal of the thin-film transistor TR2, a second terminal coupled to a readout signal line ROx, and a control terminal coupled to the scan line signal SCNy. The thin-film transistor TR3 can connect or disconnect the first terminal of the thin-film transistor TR3 and the readout signal line ROx according to the scan line signal SCNy. When the first terminal of the thin-film transistor TR3 is connected to the readout signal line ROx, it can output the amplified current IAMP to the readout signal line ROx. When the first terminal of the thin-film transistor TR3 is disconnected from the readout signal line ROx, not amplified current IAMP is output to the readout signal line ROx. By collecting the amplified current IAMP generated by the sensing elements 100U, a fingerprint can be pieced together, especially through a plurality of sensing elements 100U that are electrically connected in parallel.

Figure 4B:
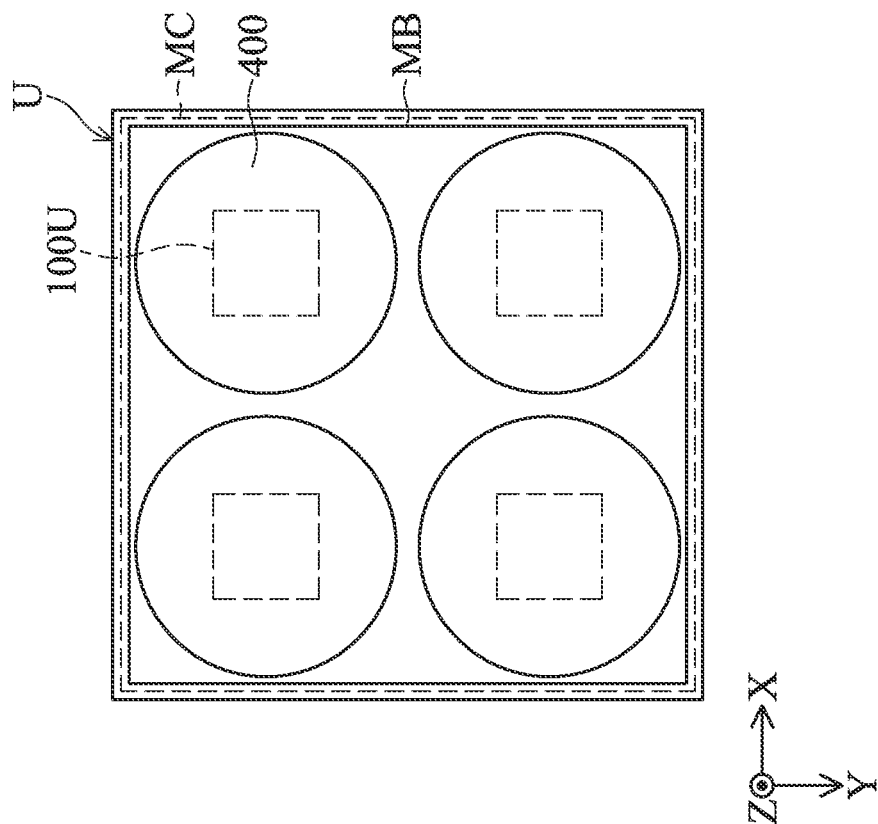
FIGS. 4A-4C are top-view diagrams of some elements of a sensing device in accordance with some embodiments of the present disclosure.
Figure 4A:
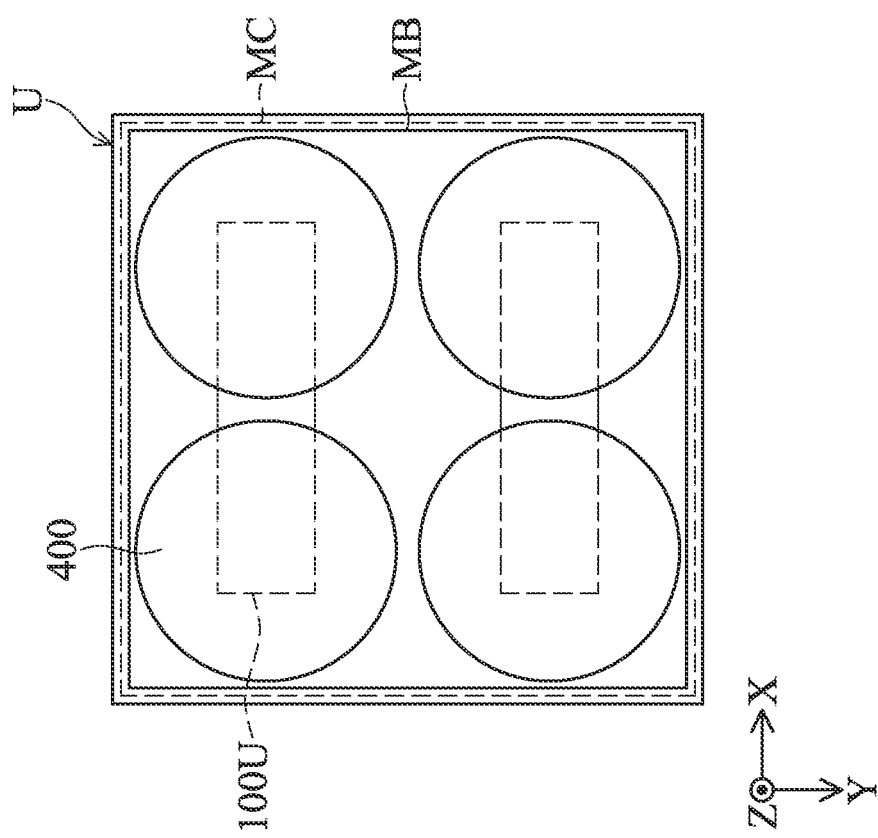
Figure 4C:
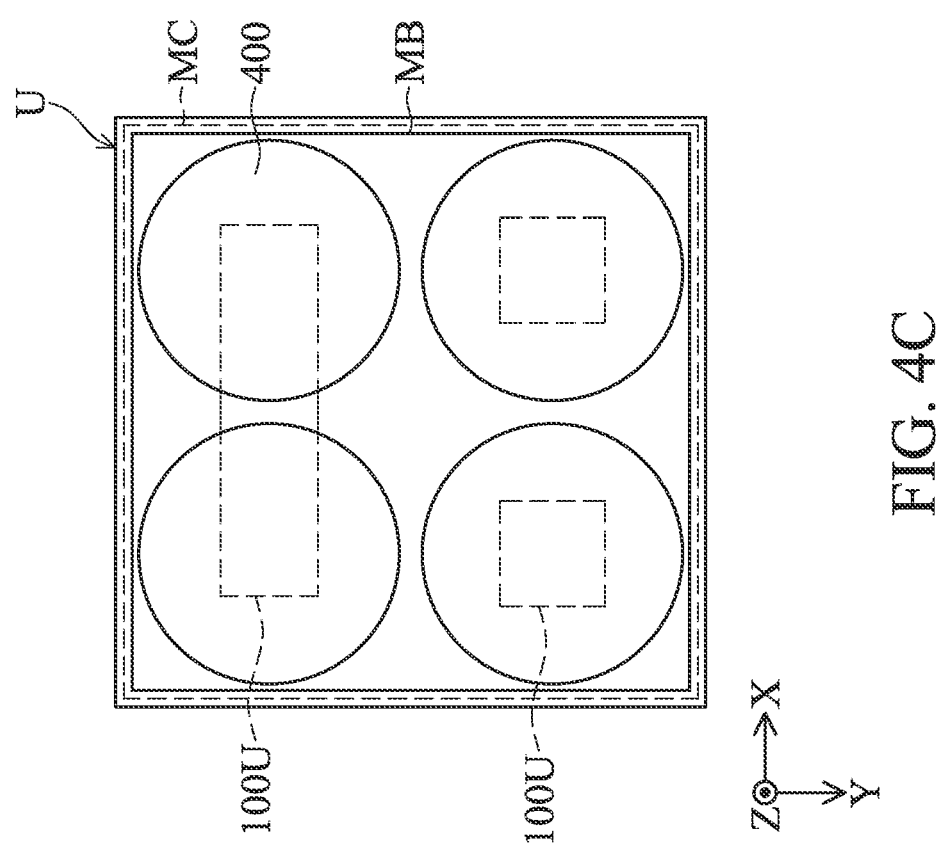

Next, refer to FIGS. 4A-4C, which are top-view diagrams of the sensing elements 100U and the light-collecting elements 400 of a sensing device in accordance with some embodiments of the present disclosure. It should be understood that, for clear description, FIGS. 4A-4C only illustrate the diagrams of partial sensing elements 100U and light-collecting elements 400 to further describe their configuration.

In some embodiments, in a top-view perspective, the sensing element 100U is rectangular, and the light-collecting element 400 is circular, but the present disclosure is not limited thereto. According to different embodiments, the sensing element 100U and the light-collecting element 400 may have any other suitable shape. Furthermore, in some embodiments, the sensing device has a plurality of light-collecting elements 400. For example, the light-collecting elements 400 may form an array in a 2×2 manner, and the array can be regarded as a light-collecting unit U. That is, the sensing device may have a plurality of light-collecting units U. In a light-collecting unit U, each of the sensing elements 100U is electrically connected to the conductive layer MB (e.g., an anode) and the conductive layer MC (e.g., a cathode), and the sensing elements 100U are electrically connected with each other in parallel. In addition, the conductive layer MB may be a patterned conductive layer MB, and the conductive layer MC may be a patterned conductive layer MC, but it is not limited thereto. When the sensing elements 100U of the light-collecting unit U are irradiated by lights, the photocurrents generated by the sensing elements 100U all can be derived through the conductive layer MB and the conductive layer MC of the light-collecting unit U. That is, a plurality of sensing signals are output as a whole, thereby reducing the impact of parasitic capacitance. However, it should be understood that the number and arrangement of the sensing elements 100U and the light-collecting elements 400 are not limited to those shown in the figure. According to different embodiments, the sensing device may have any suitable number of sensing elements 100U and light-collecting elements 400. In addition, according to different embodiments, the sensing elements 100U and the light-collecting elements 400 of the sensing device may be configured in another suitable arrangement.

As shown in FIG. 4A, the number of sensing elements 100U may be less than the number of light-collecting elements 400. For example, one sensing element 100U may correspond to two light-collecting elements 400. That is, in the normal direction of the substrate 102 (for example, the Z direction in the figure), one sensing element 100U may at least partially overlap two light-collecting elements 400. In addition, a portion of the sensing element 100U may not overlap the light-collecting element 400.

As shown in FIG. 4B, in some embodiments, the number of sensing elements 100U may be equal to the number of light-collecting elements 400. For example, one sensing element 100U may correspond to one light-collecting element 400. That is, in the normal direction of the substrate 102 (for example, the Z direction in the figure), one sensing element 100U may at least partially overlap one light-collecting element 400. In some embodiments, the light-collecting element 400 may entirely overlap the sensing element 100U.

As shown in FIG. 4C, in some embodiments, the number of sensing elements 100U may be less than the number of light-collecting elements 400. For example, in one light collecting unit U, part of the sensing elements 100U may correspond to one light-collecting element 400, that is, in the normal direction of the substrate 102 (for example, the Z direction in the figure), one sensing element 100U may at least partially overlap one light-collecting element 400; in addition, part of the sensing elements 100U may correspond to two light-collecting elements 400, that is, in the normal direction of the substrate 102 (for example, the Z direction in the figure), one sensing element 100U may at least partially overlap two light-collecting elements 400.

Figure 5A:
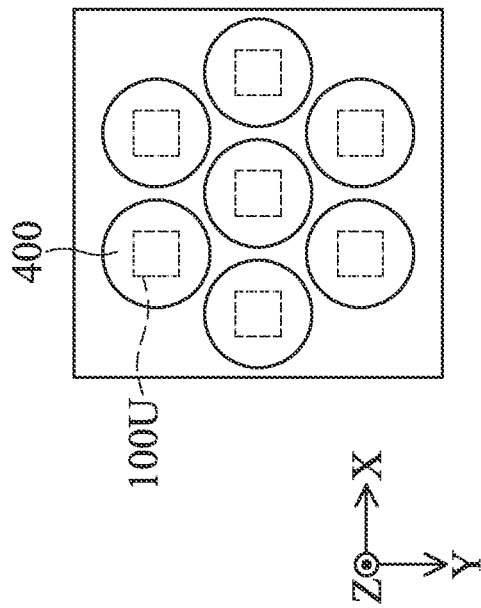
FIGS. 5A-5C are top-view diagrams of some elements of a sensing device in accordance with some embodiments of the present disclosure.
Figure 5C:
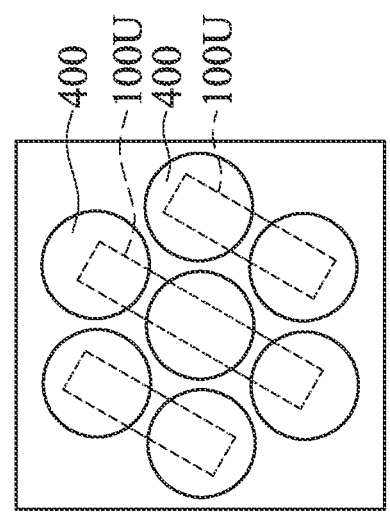
Figure 5B:
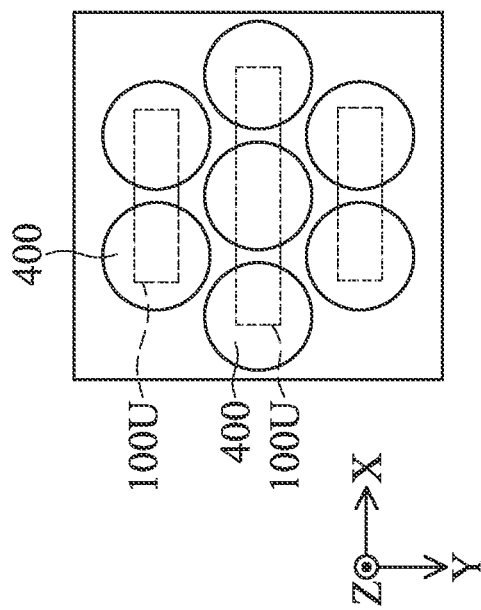

Next, refer to FIGS. 5A-5C, which are top-view diagrams of partial sensing elements 100U and light-collecting elements 400 of a sensing device in accordance with some other embodiments of the present disclosure. It should be understood that, for clear description, some elements of the sensing device are omitted in the drawing, and only some elements are schematically drawn to further describe their configuration.

As shown in FIGS. 5A-5C, in some embodiments, the sensing device may have, for example, seven light-collecting elements 400, and the light-collecting elements 400 are arranged in a hexagonal array. For example, the first row may include two light-collecting elements 400, the second row may include three light-collecting elements 400, and the third row may include two light-collecting elements 400, but the number of light-collecting elements 400 is not limited thereto.

As shown in FIG. 5A and FIG. 5C, the number of sensing elements 100U may be less than the number of light-collecting elements 400. For example, part of the sensing elements 100U may correspond to two light-collecting elements 400, and part of the sensing elements 100U may correspond to three light-collecting elements 400. That is, in the normal direction of the substrate 102 (for example, the Z direction in the figure), one sensing element 100U may at least partially overlap two or three light-collecting elements 400. In addition, a portion of the sensing element 100U may not overlap the light-collecting element 400. Furthermore, as shown in FIG. 5A, the extending direction of the sensing element 100U may be the same as the direction in which the light-collecting elements 400 of the first row are arranged (for example, the X direction in the figure). Alternatively, as shown in FIG. 5C, the extending direction of the sensing element 100U may be different from the direction in which the first row of light-collecting elements 400 are arranged (for example, the X direction in the figure).

As shown in FIG. 5B, in some embodiments, the number of sensing elements 100U may be equal to the number of light-collecting elements 400. For example, one sensing element 100U may correspond to one light-collecting element 400. That is, in the normal direction of the substrate 102 (for example, the Z direction in the figure), one sensing element 100U may at least partially overlap one light-collecting element 400. In some embodiments, the light-collecting element 400 may entirely overlap the sensing element 100U.

Figure 6B:
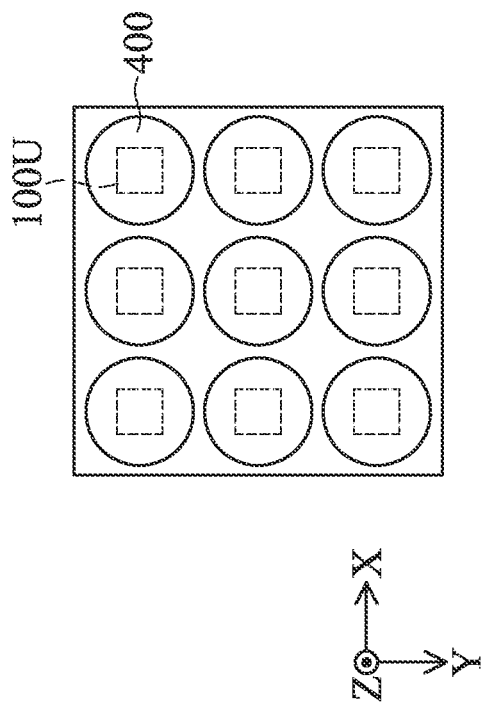
FIGS. 6A-6C are top-view diagrams of some elements of a sensing device in accordance with some embodiments of the present disclosure.
Figure 6C:
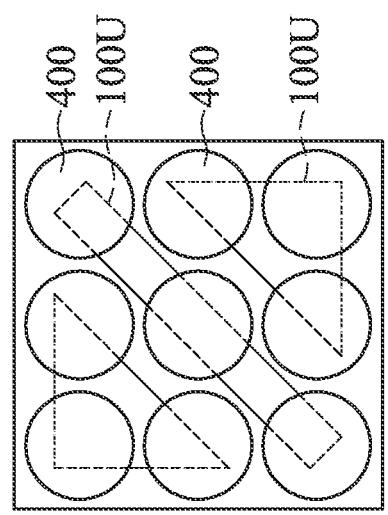
Figure 6A:
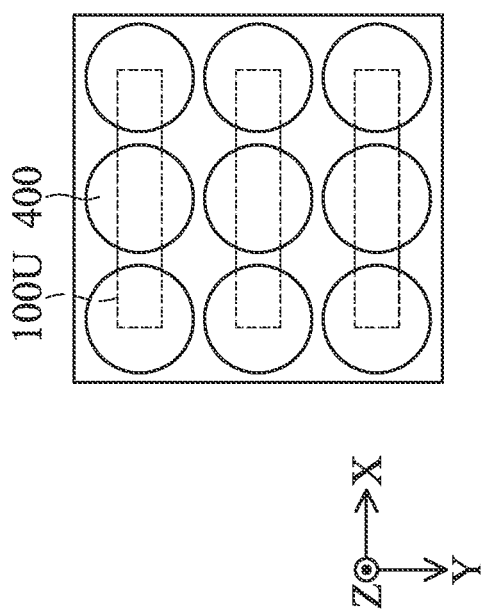

Next, refer to FIGS. 6A-6C, which are top-view diagrams of partial sensing elements 100U and light-collecting elements 400 of a sensing device in accordance with some other embodiments of the present disclosure. It should be understood that, for clear description, some elements of the sensing device are omitted in the drawing, and only some elements are schematically drawn to further describe their configuration.

As shown in FIGS. 6A-6C, in some embodiments, the sensing device may include, for example, nine light-collecting elements 400, and the light-collecting elements 400 are arranged in a 3×3 array, but the number of light-collecting elements 400 is not limited thereto. As shown in FIGS. 6A-6C, the number of sensing elements 100U may be less than the number of light-collecting elements 400. For example, one sensing element 100U may correspond to three light-collecting elements 400. That is, in the normal direction of the substrate 102 (for example, the Z direction in the figure), one sensing element 100U may at least partially overlap three light-collecting elements 400. In addition, a portion of the sensing element 100U may not overlap the light-collecting element 400. Furthermore, as shown in FIG. 6C, in some embodiments, some of the sensing elements 100U may have the same shape (e.g., a triangle), and some of the sensing elements 100U may have a different shape (for example, a rectangle). In some other embodiments, the sensing elements 100U may all have different shapes.

As shown in FIG. 6B, the number of sensing elements 100U may be equal to the number of light-collecting elements 400. For example, one sensing element 100U may correspond to one light-collecting element 400. That is, in the normal direction of the substrate 102 (for example, the Z direction in the figure), one sensing element 100U may at least partially overlap one light-collecting element 400. In some embodiments, the light-collecting element 400 may entirely overlap the sensing element 100U.

Figure 7A:
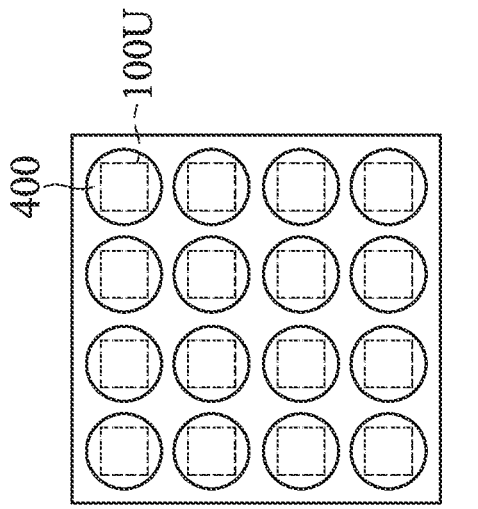
FIGS. 7A-7C are top-view diagrams of some elements of a sensing device in accordance with some embodiments of the present disclosure.
Figure 7B:
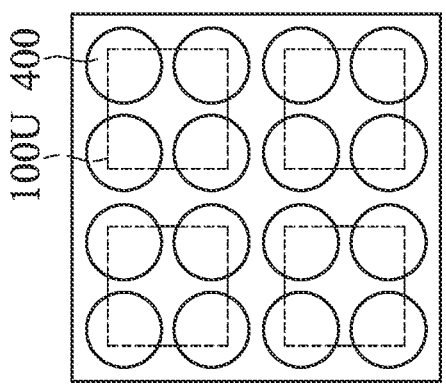
Figure 7C:
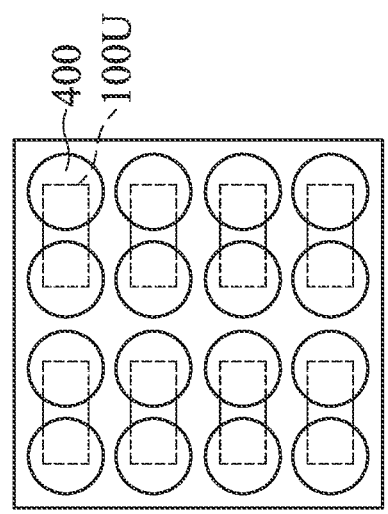

Next, refer to FIGS. 7A-7C, which are top-view diagrams of partial sensing elements 100U and light-collecting elements 400 of a sensing device in accordance with some other embodiments of the present disclosure. It should be understood that, for clear description, some elements of the sensing device are omitted in the drawing, and only some elements are schematically drawn to further describe their configuration.

As shown in FIGS. 7A-7C, in some embodiments, the sensing device may have, for example, sixteen light-collecting elements 400, and the light-collecting elements 400 are arranged in a 4×4 array, but the number of light-collecting elements 400 is not limited thereto. As shown in FIG. 7A and FIG. 7C, the number of sensing elements 100U may be less than the number of light-collecting elements 400. For example, one sensing element 100U may correspond to four light-collecting elements 400 (as shown in FIG. 7A) or two light-collecting elements 400 (as shown in FIG. 7C). In addition, a portion of the sensing element 100U may not overlap the light-collecting element 400.

As shown in FIG. 7B, the number of sensing elements 100U may be equal to the number of light-collecting elements 400. For example, one sensing element 100U may correspond to one light-collecting element 400. That is, in the normal direction of the substrate 102 (for example, the Z direction in the figure), one sensing element 100U may at least partially overlap one light-collecting element 400. In some embodiments, the light-collecting element 400 may entirely overlap the sensing element 100U.

Figure 8A:
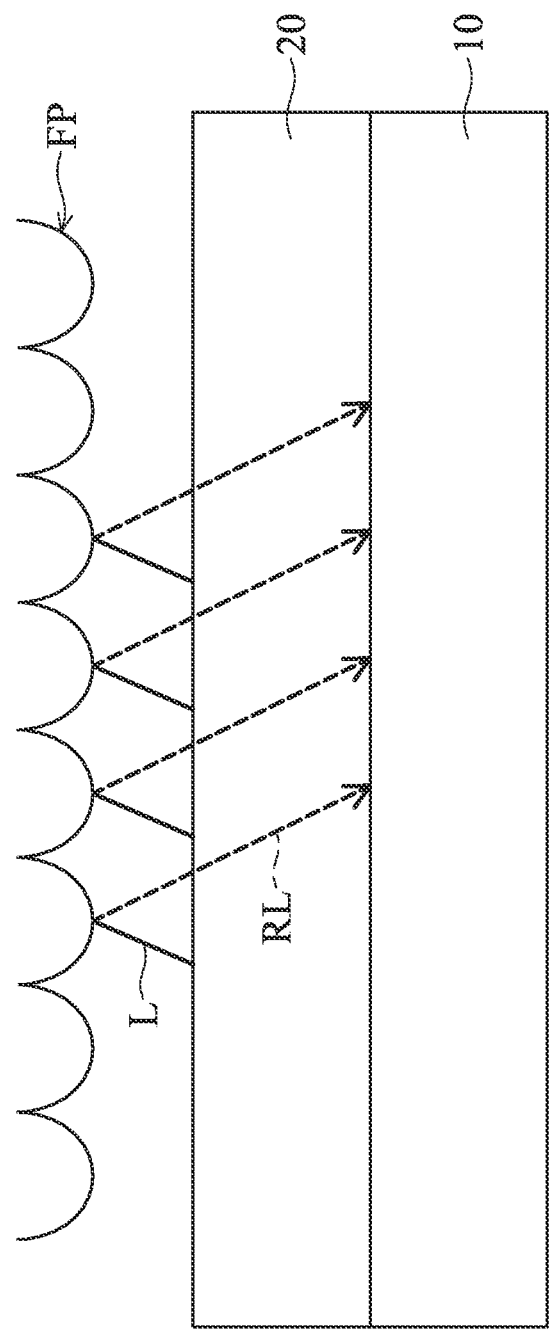
FIG. 8A and FIG. 8B are schematic diagrams of an electronic device in accordance with some embodiments of the present disclosure.
Figure 8B:
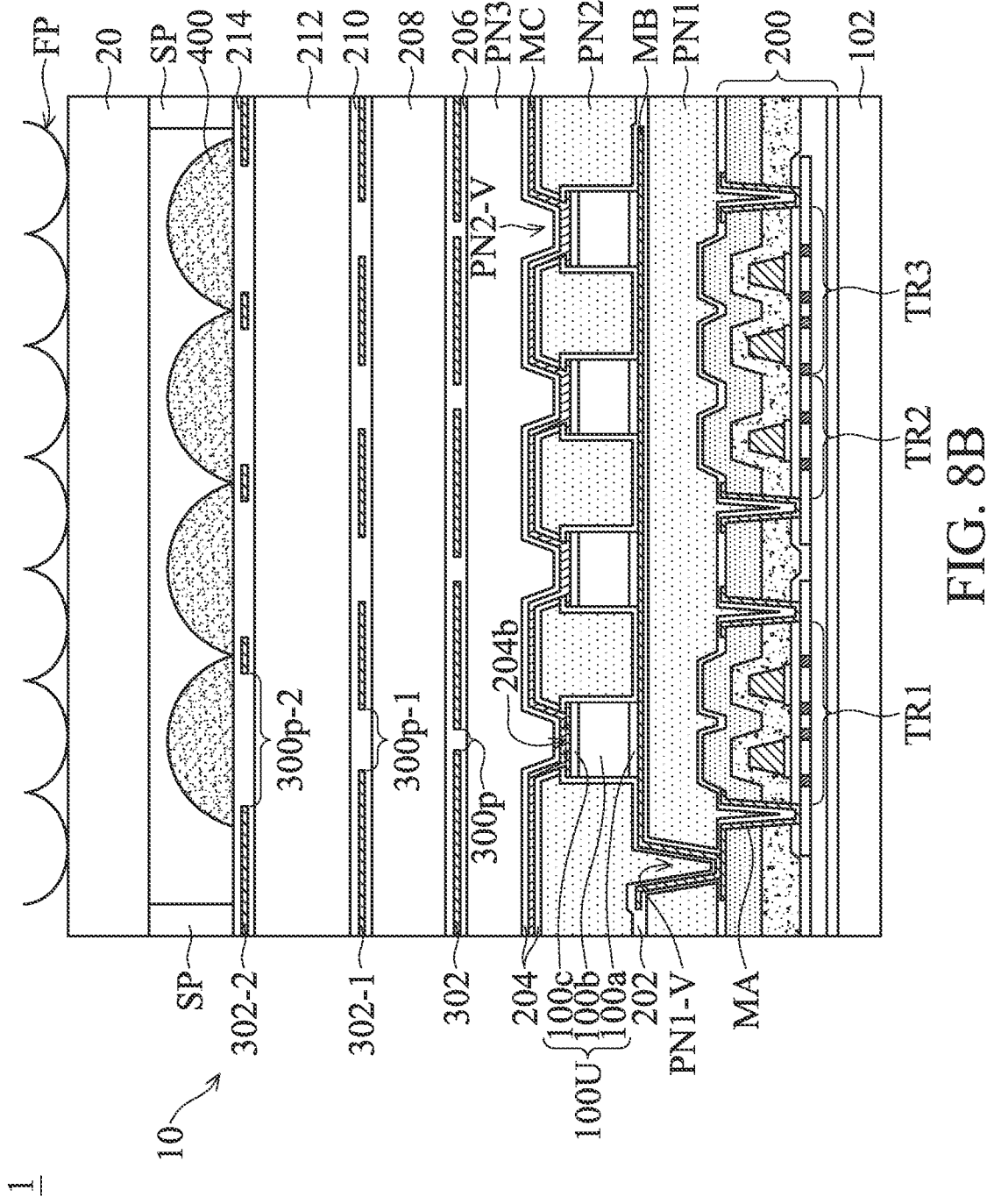

Next, refer to FIG. 8A and FIG. 8B, which are schematic diagrams of an electronic device 1 in accordance with some embodiments of the present disclosure. It should be understood that, for clear description, the drawings only schematically illustrate some of the components of the electronic device 1. In accordance with some embodiments, additional features can be added to the electronic device 1 described below.

In some embodiments, the electronic device 1 includes the aforementioned sensing device 10 and a display device 20, and the sensing device 10 is disposed opposite the display device 20. In some embodiments, the electronic device 1 has functions such as touch-sensing or fingerprint recognition. For example, the electronic device 1 may be a touch display device, but it is not limited thereto. For example, the light L generated by the display device 20 is reflected by a finger FP to generate the reflected light RL, and the reflected light RL can be transmitted to the sensing device 10 after passing through the display device 20. The sensing device 10 can sense the touch of the finger, and convert it into an electronic signal to the corresponding driving component or signal processing component for identification and analysis. Specifically, the sensing device 10 may be fixed to the display device 20 through an adhesive layer, or the sensing device 10 may be fixed to the display device 20 through a spacer SP. When the sensing device 10 is fixed to the display device 20 through the spacer SP, there may be air or other media between the sensing device 10 and the display device 20. The light L generated by the display device 20 is reflected by the finger FP and then generates the reflected light RL. The reflected light RL can be transmitted to the sensing device 10 through the air, and the sensing device 10 can sense the touch of the finger. The adhesive layer or spacer may include a material with adhesiveness. In some embodiments, the adhesive layer may include a light-curable adhesive material, a heat-curable adhesive material, a light-heat-curable adhesive material, another suitable material, or a combination thereof, but it is not limited thereto. For example, in some embodiments, the adhesive layer may include, but is not limited to, optical clear adhesive (OCA), optical clear resin (OCR), pressure sensitive adhesive (PSA), another suitable material, or a combination thereof.

In some embodiments, the display device 20 may include, for example, a liquid-crystal display panel, a light-emitting diode display panel, such as an inorganic light-emitting diode display panel, an organic light-emitting diode (OLED) display panel, a mini light-emitting diode (mini LED) display panel, a micro light-emitting diode (micro LED) display panel, or a quantum dot (QD) light-emitting diode (e.g., QLED or QDLED) display panel, but it is not limited thereto.

To summarize the above, in accordance with some embodiments of the present disclosure, the provided sensing device can reduce the equivalent capacitance of the sensing elements through the configuration design of the sensing circuit and the sensing elements. Therefore, the sensitivity of the sensing elements can be improved, or the overall performance of the sensing device can be improved. The display quality and sensing performance of the electronic device can be further enhanced.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A sensing device, comprising:
    a sensing circuit;
    a plurality of sensing elements;
    a plurality of light-collecting elements for collecting lights to the plurality of sensing elements;
    a first light-shielding layer disposed between the plurality of sensing elements and the plurality of light-collecting elements;
    a second light-shielding layer disposed on the first light-shielding layer; and
    a third light-shielding layer disposed on the second light-shielding layer,
    wherein the plurality of sensing elements are configured to generate a plurality of sensing signals according to the lights that are collected, and output the plurality of sensing signals as a whole to the sensing circuit,
    wherein the plurality of sensing elements are electrically connected to the same terminal of the sensing circuit,
    wherein the first light-shielding layer has a plurality of first openings overlapping the plurality of sensing elements, the second light-shielding layer has a plurality of second openings overlapping the plurality of first openings, and the third light-shielding layer has a plurality of third openings overlapping the plurality of second openings,
    wherein a width of one of the plurality of second openings is greater than or equal to 0.5 times a width of one of the plurality of first openings and less than or equal to 2.5 times the width of one of the plurality of first openings, and a width of one of the plurality of third openings is greater than or equal to 2 times the width of one of the plurality of first openings and less than or equal to 4 times the width of one of the plurality of first openings,
    wherein the width of one of the plurality of first openings is greater than or equal to 2 micrometers and less than or equal to 6 micrometers.

2. The sensing device as claimed in claim 1, wherein a number of the plurality of sensing elements is less than or equal to a number of the plurality of light-collecting elements.

3. The sensing device as claimed in claim 1, wherein the terminal is a floating diffusion node.

4. The sensing device as claimed in claim 1, wherein the plurality of sensing elements are electrically connected to each other in parallel.

5. The sensing device as claimed in claim 1, wherein the plurality of light-collecting elements are microlenses.

6. The sensing device as claimed in claim 1, wherein the plurality of sensing elements at least partially overlap the plurality of light-collecting elements.

7. The sensing device as claimed in claim 1, further comprising a planarization layer, wherein a part of the planarization layer is disposed between the plurality of sensing elements, wherein the part of the planarization layer at least partially overlaps the plurality of light-collecting elements.

8. The sensing device as claimed in claim 7, further comprising a conductive layer disposed on the planarization layer, wherein the plurality of sensing elements are electrically connected to the conductive layer.

9. The sensing device as claimed in claim 8, further comprising an active layer, wherein the planarization layer is disposed on the active layer and the plurality of sensing elements are electrically connected to the active layer through the conductive layer.

10. The sensing device as claimed in claim 7, wherein the plurality of sensing elements are separated from each other by the part of the planarization layer.

11. The sensing device as claimed in claim 1, wherein the plurality of first openings overlap the plurality of light-collecting elements.

12. The sensing device as claimed in claim 1, wherein a width of one of the plurality first openings is smaller than a width of one of the plurality of sensing elements.

13. An electronic device, comprising:
    a display device; and
    a sensing device disposed opposite the display device, and the sensing device comprising:
    a sensing circuit;
    a plurality of sensing elements;

a plurality of light-collecting elements for collecting lights to the plurality of sensing elements;

a first light-shielding layer disposed between the plurality of sensing elements and the plurality of light-collecting elements;

a second light-shielding layer disposed on the first light-shielding layer; and a third light-shielding layer disposed on the second light-shielding layer, wherein the plurality of sensing elements are configured to generate a plurality of sensing signals according to the lights that are collected, and output the plurality of sensing signals as a whole to the sensing circuit, wherein the plurality of sensing elements are electrically connected to the same terminal of the sensing circuit, wherein the first light-shielding layer has a plurality of first openings overlapping the plurality of sensing elements, the second light-shielding layer has a plurality of second openings overlapping the plurality of first openings, and the third light-shielding layer has a plurality of third openings overlapping the plurality of second openings, wherein a width of one of the plurality of second openings is greater than or equal to 0.5 times a width of one of the plurality of first openings and less than or equal to 2.5 times the width of one of the plurality of first openings, and a width of one of the plurality of third openings is greater than or equal to 2 times the width of one of the plurality of first openings and less than or equal to 4 times the width of one of the plurality of first openings, wherein the width of one of the plurality of first openings is greater than or equal to 2 micrometers and less than or equal to 6 micrometers.

14. The electronic device as claimed in claim 13, wherein a number of the plurality of sensing elements is less than or equal to a number of the plurality of light-collecting elements.

15. The electronic device as claimed in claim 13, wherein the plurality of sensing elements are electrically connected to each other in parallel.

* * * * *